United States Patent
Berben et al.

(10) Patent No.: US 8,482,191 B2
(45) Date of Patent: Jul. 9, 2013

(54) CONVERSION LED

(75) Inventors: Dirk Berben, Bobingen (DE); Dominik Eisert, Regensburg (DE)

(73) Assignees: OSRAM Gesellschaft mit beschraenkter Haftung, Munich (DE); OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/058,334

(22) PCT Filed: Aug. 11, 2008

(86) PCT No.: PCT/EP2008/060515
§ 371 (c)(1),
(2), (4) Date: Feb. 10, 2011

(87) PCT Pub. No.: WO2010/017831
PCT Pub. Date: Feb. 18, 2010

(65) Prior Publication Data
US 2011/0133631 A1   Jun. 9, 2011

(51) Int. Cl.
*H05B 33/02* (2006.01)

(52) U.S. Cl.
USPC .............. 313/502; 257/98; 313/501

(58) Field of Classification Search
USPC ............ 257/40, 72, 98–100, 642–643, 759;
313/498–512, 110–117; 315/169.1, 169.3;
427/58, 64, 66, 532–535, 539; 428/690–691,
428/917; 438/26–29, 34, 82, 455; 445/24–25
See application file for complete search history.

(56) References Cited

U.S. PATENT DOCUMENTS

| | | | |
|---|---|---|---|
| 7,055,987 B2 | 6/2006 | Staufert | |
| 7,521,862 B2 | 4/2009 | Mueller et al. | |
| 7,804,237 B2 | 9/2010 | Braune et al. | |
| 2004/0145308 A1 | 7/2004 | Rossner et al. | |
| 2004/0173806 A1 | 9/2004 | Chua | |
| 2005/0001230 A1* | 1/2005 | Takekuma | 257/100 |
| 2006/0226759 A1* | 10/2006 | Masuda et al. | 313/486 |
| 2007/0215890 A1* | 9/2007 | Harbers et al. | 257/98 |
| 2008/0116467 A1 | 5/2008 | Mueller et al. | |
| 2008/0122343 A1 | 5/2008 | Maruyama et al. | |
| 2009/0045420 A1* | 2/2009 | Eng et al. | 257/98 |
| 2010/0127286 A1* | 5/2010 | Schmidt et al. | 257/98 |
| 2010/0224893 A1 | 9/2010 | Liepold | |
| 2011/0002587 A1 | 1/2011 | Bogner et al. | |

FOREIGN PATENT DOCUMENTS

| | | |
|---|---|---|
| DE | 102007001706 A1 | 7/2008 |
| EP | 1480278 A2 | 11/2004 |
| WO | 03023857 A2 | 3/2003 |
| WO | WO 2006087660 A1 * | 8/2006 |
| WO | 2006111907 A2 | 10/2006 |
| WO | 2006114077 A2 | 11/2006 |
| WO | 2007140766 A2 | 12/2007 |
| WO | 2007148253 A1 | 12/2007 |

OTHER PUBLICATIONS

International Search Report of PCT/EP2008/060515 of May 8, 2009.

\* cited by examiner

*Primary Examiner* — Donald Raleigh

(57) ABSTRACT

In various embodiments, a conversion LED is provided. The conversion LED may include a chip on which a first layer containing a fluorescent substance is deposited, a second layer containing a second fluorescent substance being deposited on said first layer, wherein the first layer is a potting material in which the first fluorescent substance is dispersed, and wherein the second layer is a solid body, said first layer being provided with a spacer.

20 Claims, 1 Drawing Sheet

CONVERSION LED

RELATED APPLICATIONS

The present application is a national stage entry according to 35 U.S.C. §371 of PCT application No.: PCT/EP2008/060515 filed on Aug. 11, 2008.

TECHNICAL FIELD

The invention relates to a conversion LED according to the preamble to claim 1. Such fluorescent substances are designed in particular for use in white LEDs.

BACKGROUND

WO2006114077 discloses a conversion LED in which the converters are screen-printed onto the chip. WO2007140766 discloses a similar method.

Great efforts are currently being made to use ceramic converters for conversion LEDs. The exact positioning of said converters on the LED chip affects the reproducibility of the optical characteristics of the LED. The lateral position of a converter element on an LED chip can be captured relatively simply via cameras and used for positioning control.

The vertical position, i.e. the distance between chip and converter, is much more difficult to check. The techniques used hitherto such as screen printing involve considerable thickness variations which significantly increase the color point spread in the case of multi-fluorescent systems. Systems with separate layers of fluorescent substances of different kinds are already known per se, see e.g. EP 1 480 278 or US 2004/173806, where the longer wave fluorescent substance is also already placed closer to the chip than the shorter wave fluorescent substance. However, the thickness variation problem has so far been ignored, as no solution appeared possible.

SUMMARY

Various embodiments specify a conversion LED which uses one or more fluorescent substances, the distance between chip and converter being precisely defined.

The novel conversion LED relates particularly to hybrid applications where it has been found useful to place a longer wave fluorescent substance, in particular a red emitting fluorescent substance, closer to the chip than a second shorter wave fluorescent substance, in particular a yellow or green fluorescent substance. Here, the second shorter wave fluorescent substance is preferably a ceramic converter which is present as a rigid pad, etc. It can be a fluorescent glass or the like. A defined distance is particularly important here, because the amount of longer wave fluorescent substance can only be adjusted via the concentration if the distance from the chip to the ceramic converter is precisely known.

Basically the ceramic pad must be glued to the chip. A possible adhesive, which is introduced between chip and converter pad, is silicone as a known potting material.

The desired longer wave fluorescent substance can be dispersed into the adhesive. A specific longer wave fluorescent substance is a red emitting fluorescent substance such as a nitride or oxinitride. In order now to ensure a defined distance, a spacer is introduced into the adhesive along with the longer wave fluorescent substance. Particularly suitable as spacers are glass beads with defined properties, in particular a defined diameter, a small number of glass beads sufficient to define the distance being introduced into the adhesive.

Glass beads or glass balls of this kind are known per se. They are used among other things as calibration standards for particle size measuring equipment. They are readily available in sizes of approximately 100 nanometers to an indeterminate number of micrometers. A typical supplier is Microparticles. These standard glass balls are characterized by extremely low size variance. Moreover, the material glass, preferably toughened glass or $SiO_2$, provides very high durability and chemical inertness. Aging problems are therefore minimal.

The device is manufactured by depositing onto the chip an excess of dispersed compound, consisting of potting material, longer wave fluorescent substance and spacer. The ceramic converter pad is then pressed onto the dispersed compound until the distance between the pad and the chip corresponds to the diameter of the balls.

Alternatively to the glass balls, a strip-like spacer can also be used, particularly a frame of transparent or translucent plastic or dielectric material such as $SnO_2$. Metal is also possible, the wall possibly having cutouts through which surplus material can flow out.

Such a frame can be deposited by lithography or layer transfer. It can consist of silicone or a radiation resistant material such as Teflon. However, it is much more costly than the glass balls.

If an opaque material such as metal or POM, Delrin or polyimide is used, the frame must follow the conductor tracks on the chip surface in order to avoid shadowing losses.

The chip provided with a frame can then be filled with the desired fluorescent paste using various methods. In addition to screen printing, techniques such as doctor blading, dip coating or air brushing, etc. can be used.

As the ceramic converter is pressed onto the frame as a pad, thickness monitoring of the fluorescent paste of the shorter wave fluorescent substance is not absolutely necessary. However, a degree of monitoring is always advantageous in order to minimize the amount of paste of the shorter wave fluorescent substance which is otherwise squeezed out laterally when the ceramic pad is applied.

Without precise distance monitoring, a hybrid system of different kinds of converters does not make sense for a conversion LED. It is absolutely necessary to monitor the amount of longer wave fluorescent substance introduced between chip and ceramic pad containing shorter wave fluorescent substance.

Apart from balls or a strip-like frame, other spacers can also be used. In another exemplary embodiment, etched patterns, patterns incorporated in the converter pad such as pins or beads are used.

BRIEF DESCRIPTION OF THE DRAWINGS

The invention will now be explained in greater detail with reference to a number of exemplary embodiments and the accompanying drawings in which.

DETAILED DESCRIPTION

The following detailed description refers to the accompanying drawings that show, by way of illustration, specific details and embodiments in which the invention may be practiced.

Figure 1:
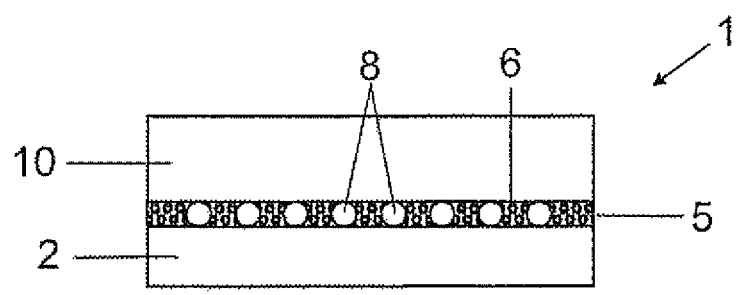
FIG. 1 shows a schematic diagram of the conversion LED with glass balls.

A conversion LED 1 as shown in FIG. 1 has a chip 2 which emits primary radiation. Said primary radiation is generally blue with a peak wavelength in the range 420 to 480 nm, preferably 450 to 470 nm.

On the chip is deposited a potting material 5 containing the longer wave fluorescent substance 6 as a dispersion. The longer wave fluorescent substance is generally a red emitting fluorescent substance as cited in the prior art, such as a nitride, an oxinitride and as disclosed in WO 2006/114077. In addition to the fluorescent particles, the potting material also contains a proportion of glass balls 8 of defined diameter, e.g. 500 nm, with low spread. A second layer is deposited over the layer of potting material. This is implemented as a ceramic converter pad 10 containing a yellow-green fluorescent substance such as YAG:Ce. A ceramic converter of this kind is disclosed in US2004145308, for example.

The glass ball concentration must of course be selected low enough to ensure that a mono-layer of glass balls 8 is loosely distributed in the resin of the potting material 5 and only acts as a support in terms of spacers. Glass balls represent a specific example with a diameter of approximately 3 µm.

Figure 2:
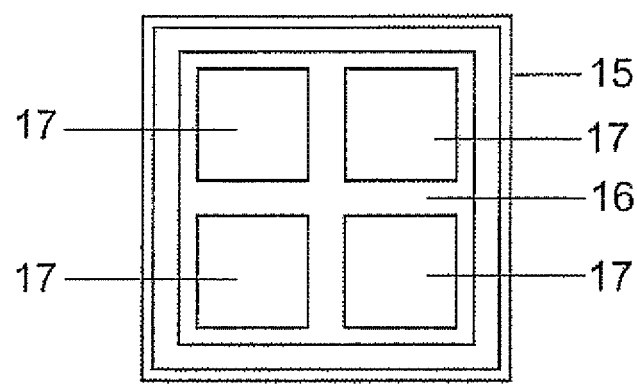
FIG. 2 shows a schematic diagram of the conversion LED with a frame.
Figure 3:
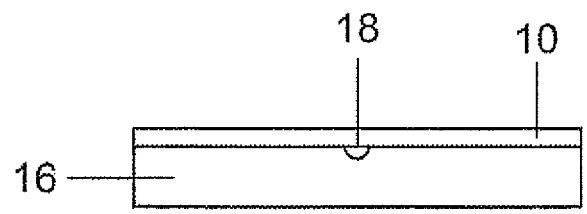
FIG. 3 shows a detail of the frame.

FIG. 2 illustrates another exemplary embodiment showing a plan view onto a chip 15 which is cut rectangularly. Placed thereon is a frame 16 acting as a spacer. It is filled with a potting material 17 containing the first fluorescent substance. To enable the surplus resin to escape, the frame is provided with breakouts 18 which are visible in the side view in FIG. 3. Seated on the frame 16 is again the pad 10 containing the shorter wave ceramic converter.

Obviously said pad cannot only be a rectangular block, but also for example lens-shaped with a flat underside and a convex upper side, but with the fluorescent substance being nevertheless contained homogeneously in a layer of equal thickness.

Figure 4:
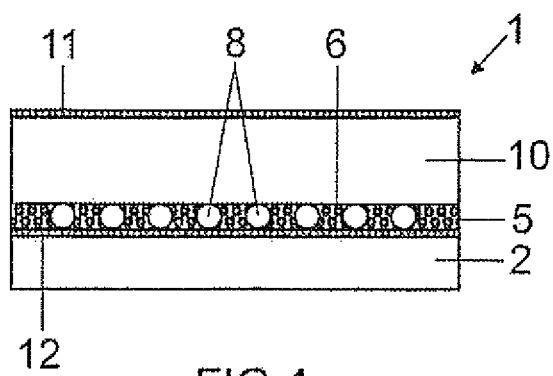
FIG. 4 shows another exemplary embodiment of a conversion LED.

FIG. 4 shows an exemplary embodiment with a UV-LED 1, wherein generally a chip 2 is used with a primary radiation in the range 300 to 420 nm, preferably 360 to 400 nm. In this case of a UV-LED, the second layer 10 with the shorter wave fluorescent substance, compared to the first layer, is followed by yet another third layer with an even shorter wave fluorescent substance, here a blue fluorescent substance, as potting material 11. However, it is alternatively or additionally also possible that the primary radiation of the UV-LED is first completely converted into blue radiation using a converter 12, shown here as a thin-film converter, connected directly preceding the chip.

The term first fluorescent substance generally also includes the possibility that this is a mixture of a plurality of fluorescent substances. The term second fluorescent substance likewise embraces the possibility that this is a mixture of a plurality of fluorescent substances. For example, a mixture of a plurality of red fluorescent substances with different peak wavelengths can be used or a mixture of a red fluorescent substance and an orange fluorescent substance.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A conversion LED, comprising:
a chip on which a first layer containing a fluorescent substance is deposited,
a second layer containing a second fluorescent substance being deposited on said first layer,
wherein the first layer is a potting material in which the first fluorescent substance is dispersed, said potting material adhering the chip and the second layer together,
wherein the second layer is a solid body, said first layer being provided with a spacer of a predefined spacing distance, and
wherein the spacer is within the potting material of the first layer.
2. The conversion LED as claimed in 1,
wherein the spacer is implemented by balls of predefined diameter.
3. The conversion LED as claimed in 1,
wherein the spacer is implemented by frame sections.
4. The conversion LED as claimed in 1,
wherein the first fluorescent substance is configured to emit at longer wavelength than the second fluorescent substance.
5. The conversion LED as claimed in 4,
wherein the first fluorescent substance is configured to emit red.
6. The conversion LED as claimed in 4,
wherein the second fluorescent substance is configured to emit in the green to yellow region.
7. The conversion LED as claimed in 1,
wherein the potting material is silicone.
8. The conversion LED as claimed in 2,
wherein the balls are made of glass.
9. The conversion LED as claimed in 2,
wherein the balls range in diameter from 150 nm to 25 µm.
10. The conversion LED as claimed in 3,
wherein the frame sections have breakouts.
11. The conversion LED as claimed in 1,
wherein the second layer is a ceramic converter.
12. The conversion LED as claimed in 1,
wherein the chip is configured to emit primary radiation in the UV to blue region.
13. The conversion LED as claimed in 5,
wherein the first fluorescent substance is configured to emit red, the peak wavelength being in the range 580 to 680 nm.
14. The conversion LED as claimed in 6,
wherein the second fluorescent substance is configured to emit in the green to yellow region, the peak wavelength being in the range 480 to 560 nm.
15. The conversion LED as claimed in 12,
wherein the chip is configured to emit primary radiation in the range 300 nm to 480 nm.
16. The conversion LED as claimed in 15,
wherein a third fluorescent substance is provided.
17. A conversion LED, comprising:
a chip on which a first layer containing a fluorescent substance is deposited,
a second layer containing a second fluorescent substance being deposited on said first layer,
wherein the first layer is a potting material in which the first fluorescent substance is dispersed,
wherein the second layer is a solid body, said first layer being provided with a spacer of a predefined spacing distance,
wherein the spacer is implemented by balls of predefined diameter, and
wherein the spacer is implemented by a single layer of balls distributed within the potting material of the first layer.
18. The conversion LED as claimed in 17,
wherein the balls are made of glass.

19. The conversion LED as claimed in 17, wherein the balls range in diameter from 150 nm to 25 μm.

20. The conversion LED as claimed in 1, wherein the spacer is distributed within the potting material of the first layer.

* * * * *